United States Patent [19]
James et al.

[11] Patent Number: 6,069,080
[45] Date of Patent: May 30, 2000

[54] FIXED ABRASIVE POLISHING SYSTEM FOR THE MANUFACTURE OF SEMICONDUCTOR DEVICES, MEMORY DISKS AND THE LIKE

[75] Inventors: David B. James, Newark; William D. Budinger, Wilmington; John V. H. Roberts, Newark, all of Del.; Michael R. Oliver, Portland, Oreg.; Nina G. Chechik; Richard M. Levering, Jr., both of Hockessin, Del.; Heinz F. Reinhardt, Chadds Ford, Pa.

[73] Assignee: Rodel Holdings, Inc., Wilimington, Del.

[21] Appl. No.: 09/138,628

[22] Filed: Aug. 24, 1998

Related U.S. Application Data

[63] Continuation-in-part of application No. 08/714,961, Sep. 17, 1996, abandoned, and application No. 09/049,864, Mar. 27, 1998, which is a continuation-in-part of application No. 09/021,437, Feb. 10, 1998, Pat. No. 6,022,264, said application No. 08/714,961, is a continuation of application No. 08/427,751, Apr. 24, 1995, abandoned, which is a continuation-in-part of application No. 08/274,134, Jul. 12, 1994, Pat. No. 5,578,362, which is a continuation of application No. 07/932,161, Aug. 19, 1992, abandoned.

[60] Provisional application No. 60/042,115, Mar. 28, 1997, provisional application No. 60/041,844, Apr. 9, 1997, provisional application No. 60/064,875, Nov. 6, 1997, and provisional application No. 60/037,582, Feb. 10, 1997.

[51] Int. Cl.[7] .................................................. H01L 21/302
[52] U.S. Cl. ............................ 438/691; 438/592; 438/593
[58] Field of Search .................................... 438/691, 692, 438/693; 451/41, 529, 526; 156/345

[56] References Cited

U.S. PATENT DOCUMENTS

| | | | |
|---|---|---|---|
| 2,609,347 | 9/1952 | Wilson | 260/2.5 |
| 2,664,366 | 12/1953 | Wilson | 117/138.8 |
| 2,806,772 | 9/1957 | Robie | 51/296 |
| 4,343,910 | 8/1982 | Busch, Jr. et al. | 51/296 |
| 4,466,218 | 8/1984 | Ottman et al. | 51/296 |
| 4,799,939 | 1/1989 | Bloecher et al. | 51/293 |
| 5,081,051 | 1/1992 | Mattingly et al. | 438/693 |
| 5,197,999 | 3/1993 | Thomas | 51/298 |
| 5,209,760 | 5/1993 | Wiand | 51/293 |
| 5,212,910 | 5/1993 | Breivogel et al. | 51/398 |
| 5,435,816 | 7/1995 | Spurgeon et al. | 51/295 |
| 5,441,598 | 8/1995 | Yu et al. | 156/645.1 |
| 5,454,844 | 10/1995 | Hibbard et al. | 51/295 |
| 5,647,879 | 7/1997 | Kubo | 51/307 |
| 5,664,990 | 9/1997 | Adams et al. | 451/41 |
| 5,868,605 | 2/1999 | Cesna | 451/41 |

*Primary Examiner*—Benjamin L. Utech
*Assistant Examiner*—Duy-Vu Deo
*Attorney, Agent, or Firm*—Konrad Kaeding; Kenneth A. Benson

[57] ABSTRACT

A fixed abrasive, chemical-mechanical polishing system which is particularly well suited for use in the manufacture of semiconductor devices, memory disks or the like.

37 Claims, 1 Drawing Sheet

FIXED ABRASIVE POLISHING SYSTEM FOR THE MANUFACTURE OF SEMICONDUCTOR DEVICES, MEMORY DISKS AND THE LIKE

RELATED APPLICATIONS

This patent application is a Continuation-In-Part of patent application Ser. No. 08/714,961 to Urbanavage et al., now abandoned filed Sep. 17, 1996 which is a Continuation of patent application Ser. No. 08/427,751 filed Apr. 24, 1995, now abandoned, which is a Continuation-in-Part of U.S. Ser. No. 08/274,134 filed Jul. 12, 1994, now U.S. Pat. No. 5,578,362, which was a Continuation of Ser. No. 07/932, 161, Aug. 19, 1992, now abandoned. This application is also a Continuation-in-Part of U.S. application Ser. No. 09/049, 864 now allowed filed on Mar. 27, 1998 which claims the priority of the following U.S. Provisional Applications: Serial No. 60/042,115 now expired filed on Mar. 28, 1997, Serial No. 60/041,844 now expired filed on Apr. 9, 1997, and Serial No. 60/064,875 now expired filed on Nov. 6, 1997 and which is a Continuation-in-Part of U.S. application Ser. No. 09/021,437 now U.S. Pat. No. 6,022,264 filed Feb. 10, 1998 which claims the priority of UDS Provisional Application 60/037,582 now expired filed Feb. 10, 1997. All of these related applications are hereby incorporated by reference into this specification.

BACKGROUND OF THE INVENTION

1. Field of the Invention

The present invention relates generally to chemical-mechanical polishing systems for use in modifying a substrate by Hertzian indentation, fluid-based wear and/or any similar-type non-microgrinding mechanism; the polishing systems of the present invention are particularly well suited for use in the manufacture of semiconductor devices, memory disks or the like. More particularly, the compositions and methods of the present invention are directed to polishing systems comprising an aqueous based polishing fluid and a fixed abrasive polishing pad.

Definition of Terms

1. Polishing. "Polishing" is intended to mean chemical-mechanical polishing (as opposed to micro-grinding) and is intended to include planarization and any corresponding variations thereof. The polishing substrates contemplated by the present invention include semiconductor device substrates, such as, silicon, silica, gallium arsenide, silicon nitride, tungsten, tantalum, aluminum, copper, and any other semiconductor device substrate, whether conducting, semi-conducting or insulating.

2. Conditioning. In the art of chemical-mechanical polishing, conventional polishing pads generally must be conditioned or otherwise roughened to initially create, then periodically renew, the pad's polishing surface. Throughout this specification, "conditioning" is intended to mean mechanical and/or chemical surface treatment of a pad's polishing surface to generate nanoasperities.

3. Nanoasperites. Throughout this specification, "nanoasperities" are intended to mean:
   i. protrusions from the pad surface; and/or
   ii. particles which release from the pad surface, having an imputed radius (of curvature) of about 0.5 to about 0.1 microns and sufficient resiliency to permanently deform (measured by the permanent change in curvature during polishing) by less than 25%, more preferably less than 10%.

4. Macro-Defects. Throughout this specification, "macro-defects" are intended to mean burrs or similar-type protrusions on the pad's polishing surface of greater than 0.5 microns in any dimension.

5. Particles. For purposes of the present invention, "particle" is intended to mean a discrete mass of material as it exists at the polishing interface. Hence, a "particle" can mean an independent, discrete primary particle, an agglomeration of primary particles which form a discrete mass, and/or primary particles which are aggregated together to form a discrete mass. Particles may sometimes be described herein as "high modulus phase material" or "high modulus domains".

6. Self-dressing. Self-dressing is intended to mean that the polishing layer abrades, dissolves, wears or otherwise diminishes during the polishing operation, and as it diminishes, new nanoasperities are formed at the polishing interface, whether the pad is periodically conditioned during its useful life or not.

7. Pre-polymer. "Pre-polymer" is intended to mean any polymer precursor, including an oligomer, monomer, reactive polymer (including cross-linkable or curable polymers) and/or the like.

2. Discussion of the Prior Art

Generally speaking, conventional fixed abrasive polishing systems are used for grinding or micro-grinding of substrates. This type of polishing has been found generally to be inappropriate for improving the planarity of substrates in the manufacture of semiconductor devices or memory disks. Hence conventional polishing systems in the manufacture of semiconductor devices or memory disks generally comprise free abrasive in a polishing fluid and a polishing pad devoid of fixed abrasives.

Such conventional polishing systems generally attempt to improve particle uniformity throughout the polishing interface by flowing large amounts of polishing slurries into the polishing interface and by using slurries with high loadings of abrasive particles. However with such conventional polishing systems, the substrate and polishing equipment generally require extensive cleaning after the polish. This cleaning step slows down production, is prone to operator error and can create environmental concerns.

A need therefore exists in the art for a polishing system which provides improved polishing uniformity along the polishing interface without the need for flowing large amounts of polishing slurries (having high particle loadings) into the polishing interface.

The prior art is exemplified by U.S. Pat. No. 4,343,910 to Bush, Jr. et al. This reference is directed to foamed polymeric materials having a finely divided abrasive. The abrasive has a particle size and a valley abrasion number, the product of which, must fall within a predetermined range; otherwise acceptable polishing is taught to be non-obtainable. Compositions in accordance with this prior art reference are problematic in the polishing of semi-conductor device substrates. Therefore, a need exists in the art for a fixed abrasive polishing system capable of meeting the rigorous polishing performance requirements of the semiconductor industry.

SUMMARY OF THE INVENTION

The present invention relates generally to an improved method of chemical-mechanical polishing of one or more substrates useful in the manufacture of semiconductor devices, memory disks or the like, including precursors thereto. In the practice of the present invention, an aqueous fluid (which may or may not contain abrasive particles) is placed between a substrate and a fixed abrasive pad. The fluid preferably provides a substantially consistent pH during polishing. The substrate to be polished is a precursor to a memory disk or a precursor to a semiconductor device.

The pad has a three dimensional fixed abrasive polishing layer. The polishing layer has a plurality of protrusions with recesses between the protrusions. The polishing layer protrusions comprise a plurality of nanoasperities. The polishing layer also contains a plurality of particles having an average particle size of less than 1 micron, preferably less than 0.6 microns, whereby the average particle size multiplied by the particle's valley abrasion number is less than 300.

The polishing surface and the substrate surface are moved relative to and are biased toward one another as at least a portion of the fluid is maintained between the surfaces. The fluid between the surfaces acts to prevent at least 20% of the surfaces, on average, from touching one another during polishing.

The surfaces are biased together by applying a uniform pressure of less than 25 pounds per square inch. The polishing surface is compressed by less than 25 microns during polishing, more preferably less than 10 microns and most preferably less than 5 microns. The resulting chemically and mechanically polishing of the substrate surface increases surface planarity.

At least a portion of the particles are released (into the polishing interface) from the fixed abrasive pad during polishing, thereby creating nanoasperities at the polishing interface. The surface area of the fixed abrasive pad at the polishing interface varies by less than 10% during the polishing operation.

The polishing layer has a matrix material as a continuous phase and the particles as a discontinuous phase, and the matrix material has the following properties:

i. a density greater than 0.5 g/cm$^3$;
  ii. a critical surface tension greater than or equal to 34 milliNewtons per meter;
  iii. a tensile modulus of 0.02 to 5 GigaPascals;
  iv. a ratio of tensile modulus at 30° C. to tensile modulus at 60° C. of 1.0 to 2.5;
  v. a hardness of 25 to 80 Shore D;
  vi. a yield stress of 300–6000 psi;
  vii. a tensile strength of 1000 to 15,000 psi; and
  viii. an elongation to break less than or equal to 500%.

The matrix material comprises at least one moiety from the group consisting of: 1. a urethane and/or urea; 2. a carbonate; 3. an amide; 4. an ester; 5. an ether; 6. an acrylate; 7. a methacrylate; 8. an acrylic acid; 9. a methacrylic acid; 10. a sulphone; 11. an acrylamide; 12. a halide; 13. an imide; 14. a carboxyl; 15. a carbonyl; 16. an amino; 17. an aldehydric and 18. a hydroxyl.

It has been found that the specified multiplication product (particle size multiplied by the valley abrasion number) is a reliable index of polishing effectiveness. If this product is too high (above 300), good polishing results generally are not achieved; preferably, the multiplication product is below 300, more preferably below 200 and yet more preferably below 100. Particles of less than a micron will generally have valley abrasion numbers of less than 300, more typically less than 200 and yet more typically less than 100. Hence, submicron particles will almost always have a product (particle size multiplied by valley abrasion number) less than 100, more typically less than 200 and most typically less than 300.

Particles of greater than a micron must have a very low valley abrasion number in order to meet the above parameter (i.e., the particle size multiplied by valley abrasion number must be less than 300, etc). In other words, particles having a size greater than a micron must generally be very soft or non-abrasive, to meet this parameter. Such a low valley abrasion number results in particles which are friable under typical polishing conditions, thereby causing such large particles to fracture into pieces which are less than a micron during polishing. Since (for purposes of the present invention), "particle" is intended to mean a discrete mass of material as it exists at the polishing interface, particles in accordance with the present invention will generally be or become submicron in size at the polishing interface.

This invention thus enables those skilled in the art to select an abrasive compound having a suitable particle size and a suitable valley abrasion number such that satisfactory polishing will result when the compound has been incorporated into the specified polymer matrix and the composition is used to polish a surface of a semiconductor device (or integrated circuit) or a precursor thereto.

Polishing in accordance with the present invention is directed to the removal of surface protrusions by severing the chemical bonds between the protrusion and the surface. This mechanism occurs at a molecular level and is much different from micro-grinding. Micro-grinding occurs on a much larger scale, such as by surface fracturing, cutting or abrading, thereby creating unwanted macro-defects. By using the product of particle size and valley abrasion number as a critical parameter of the present invention, the polishing system of the present invention is able to reliably provide chemical mechanical polishing substantially devoid of unwanted grinding or micro-grinding.

Polishing pads in accordance with the present invention comprise a polishing layer created, at least in part, by solidifying a flowable material (including the sintering of flowable solids) into a hydrophilic, polishing layer matrix. Bonded within or onto the polishing layer matrix is a plurality of particulate matter.

The polishing fluid is preferably water based and may also comprise polishing particles (in addition to any particles exposed by or released from the pad). The polishing fluid preferably comprises a pH modifier and optionally a pH buffer, surfactant, chelating agent, and/or oxidizer.

To provide consistency of polishing performance, the polishing pad topography should have a configuration whereby as the pad wears during its useful life, the amount of surface area capable of contacting the substrate changes by less than 30%, more preferably less than 10% and most preferably less than 5%.

BRIEF DESCRIPTION OF THE DRAWINGS

FIG. 2 is a schematic side view of the polishing pad and polishing slurry of the present invention as used to planarize a substrate for use in the manufacture of a semiconductor device or the like.

DETAILED DESCRIPTION OF THE PREFERRED EMBODIMENT(S)

Overview

The present invention is directed to a single layer or multi-layer polishing pad having a polishing layer containing particulate matter. Preferably, the weight ratio of particulate matter to the remaining portions of the polishing layer (the hydrophilic matrix material) is in the range of 0.00005:1 to 10:1, more preferably 0.05:1 to 1:1.

The particulate material is preferably a finely divided, substantially water insoluble material having a solid surface which is capable of providing Hertzian-based wear or fluid-based wear (as opposed to grinding or micro-grinding) when rubbed on a surface in accordance with the present invention. In one preferred embodiment, substantially all of the particles are less than 1 micron and have an average particle size of between 0.01 to about 1 microns. "Particle size" is intended to mean the discrete, non-friable (under conventional polishing conditions) masses located within the pad, whether such masses are primary particles, fused primary particles, agglomerated primary particles, agglomerated fused particles, porous particles, hollow particles and/or the like; if the particle is friable or otherwise will reduce in size under typical polishing conditions, then particle size is intended to mean the ultimate size of the particle after being subjected to the polishing interface. In some embodiments, the particles are hollow, contain voids or otherwise have characteristics which will tend to cause the particle to collapse or otherwise diminish when subjected to the polishing interface.

The abrasive may be selected from any of the known materials conventionally employed for polishing, providing the product of the particle size and valley abrasion number is in accordance with this invention. Examples of suitable materials include diatomite (diatomaceous earth), calcium carbonate, dicalcium phosphate, pumice, silica, calcium pyrophosphate, rouge, kaolin, ceria, alumina and titania, most preferably silica, alumina, titania and ceria.

In some embodiments, a combination of "hard" particles (particles consisting of a material having a Mohs hardness of more than 6) with "soft" particles (particles consisting of a material having a Mohs hardness of less than 6) is advantageous. In such an embodiment, the soft particles will tend to fracture or otherwise erode during polishing, thereby improving the polishing performance of the hard particles. Although the mechanism for this is not well understood, one theory is that the soft particles provide shock absorption to the polishing system, thereby diminishing unwanted scratching.

The hydrophilic matrix material preferably comprises a urethane. Preferred urethane polymers may be prepared using methods of preparation known to those skilled in the art. Illustratively, the preferred hydrophilic polyurethane is made by polymerizing an alkylene oxide, e.g., ethylene oxide, in the presence of a polyfunctional hydroxyl-containing compound, e.g., glycerol, trimethylolpropane, trimethylolethane, pentacrythritol, or the like, to yield a polyoxyalkylene polyol. The polyoxyalkylene polyol is thereafter reacted with a polyisocyanate, preferably using a stoichiometric excess of the polyisocyanate. Examples of suitable polyisocyanates include tolyene diisocyanate, triphenylmethane-4,4',4"-triisocyanate, benzene-1,3,5-triisocyanate, hexamethylene diisocyanate, xylene diisocyanate, chlorophenylene diisocyanate, and methylenebisdiphenyl diisocyanate as well as mixtures of any of the foregoing.

The reaction may be carried out under nitrogen at atmospheric pressure, using a temperature in the range of 0° and 120° C., for a period of about 20 hours although particular reaction times will vary depending on factors such as the reaction temperature, the amount of mixing conducted during the reaction, and the reactivity of the isocyanate.

The preferred polyvinyl alcohol-formaldehyde reaction product (polyvinyl formal) may be prepared by following procedures described in U.S. Pat. No. 2,609,347 and U.S. Pat. No. 2,664,366, the disclosures of which are incorporated herein by reference to save detail.

The preferred hydrophilic matrix is characterized by having a maximum elastic deformation strength of at least about 100 pounds per square inch. The maximum elastic deformation strength is determined by measuring and plotting the stress-strain curve of a substantially void-free, for example, solution cast, film of the matrix component and drawing a straight line tangent and coincident with the initial straight portion of the stress-strain curve representing elastic deformation.

The maximum elastic deformation is the stress at the point at which the aforementioned straight line departs from the stress-strain curve. The stress-strain data is preferably determined on an Instron tensile tester, Model TTB at a speed of 100% elongation per minute using a one-half inch wide rectangular sample, usually about 10 to 20 mils thick and one inch between grips. A wide spectrum of such polymers can be employed in accordance with the present invention, for example, vinyl addition polymers, and polyurethanes and condensation polymers, such as, polyamides, polyesteramides and polyesters, vinyl chloride polymers and copolymers, and acrylic acid and methacrylic acid polymer and copolymers. A particularly useful polymer is a polyurethane or polyurethane copolymer, particularly polyurethanes containing urea functional groups.

The polishing compositions of this invention, comprising the polymers of choice, are prepared by mixing the ingredients together under ambient conditions and permitting the mixture to (optionally foam) and to harden. Preferably, an aqueous slurry of the abrasive compound is prepared separately and then admixed with the polymer. In those compositions in which the polymer is a polyurethane, it is preferred to use from about 1 to about 200 parts, more usually from about 10 to 160 parts, of water for each 100 parts of the polymer, on a weight basis.

Heat may be applied during mixing. Care should be taken not to exceed the decomposition temperature of the polymer or the temperature at which thermal damage to the polymer results—generally about 200° F. Once these two components are adequately mixed (substantially complete blending of the one component within the other), the mixture is de-watered, such as by spray drying, oven drying or the like.

As water is removed from the mixture, the resulting composition solidifies, with or without chemical reaction. Possible chemical reactions include curing, grafting, crosslinking, chain extension or the like. After solidification, heat may be applied to drive off water and thus facilitate drying. The final polishing composition may be manufactured into articles of any desired shape or size. Preferably, the polishing surface is substantially flat, or at least is capable of being flattened with a pressure of less than 12 pounds per square inch.

As used in this specification, "particle size" is intended to mean the distance of the particle's largest dimension (either height, length or width). Preferred particles have an average particle size of less than or equal to about 0.6 microns but preferably greater than or equal to 0.05 microns; more preferably, at least 80 weight percent, more preferably 95 weight percent, and yet more preferably 100 weight percent, of the particles have a size in the range of 0.01 to 0.5 microns.

In one embodiment, the particulate material comprises at least about 50 weight percent, more preferably 80 weight percent and most preferably greater than 95 weight percent particles having an average surface area ranging from about 25 square meters per gram to about 430 square meters per gram and an average diameter or average aggregate diameter of less than about 1 micron, more preferably less than about 0.6 microns. Preferred oxide particles of the present invention are alumina, silica, iron oxide, titania and ceria.

The surface area of the particles can be measured by the nitrogen adsorption method of S. Brunauer, P. H. Emmet and I. Teller, J. Am. Chemical Society, Volume 60, page 309 (1938) which is commonly referred to as BET measurement. Aggregate size can be determined by known techniques, such as, that described in ASTM D3849-89; measurements can be recalled individually or in the form of statistical or histogram distributions. Aggregate size distribution can be determined by transmission electron microscopy (TEM) The mean aggregate diameter can be determined by the average equivalent spherical diameter when using TEM image analysis, i.e., based upon the cross-sectional area of the aggregate.

The hydrophilic matrix material of the present invention is sufficiently hydrophilic to provide a critical surface tension greater than or equal to 34 milliNewtons per meter, more preferably greater than or equal to 37 and most preferably greater than or equal to 40 milliNewtons per meter. Critical surface tension defines the wettability of a solid surface by noting the lowest surface tension a liquid can have and still exhibit a contact angle greater than zero degrees on that solid. Thus, polymers with higher critical surface tensions are more readily wet and are therefore more hydrophilic. Critical Surface Tension of common polymers are provided below:

| Polymer | Critical Surface Tension (mN/m) |
|---|---|
| Polytetrafluoroethylene | 19 |
| Polydimethylsiloxane | 24 |
| Silicone Rubber | 24 |
| Polybutadiene | 31 |
| Polyethylene | 31 |
| Polystyrene | 33 |
| Polypropylene | 34 |
| Polyester | 39–42 |
| Polyacrylamide | 35–40 |
| Polyvinyl alcohol | 37 |
| Polymethyl methacrylate | 39 |
| Polyvinyl chloride | 39 |
| Polysulfone | 41 |
| Nylon 6 | 42 |
| Polyurethane | 45 |
| Polycarbonate | 45 |

In one embodiment, the low modulus phase is derived from at least:
1. an acrylated urethane;
2. an acrylated epoxy;
3. an ethylenically unsaturated organic compound having a carboxyl, benzyl, or amide functionality;
4. an aminoplast derivative having a pendant unsaturated carbonyl group;
5. an isocyanurate derivative having at least one pendant acrylate group;
6. a vinyl ether,
7. a urethane
8. a polyacrylamide
9. an ethylene/ester copolymer or an acid derivative thereof;
10. a polyvinyl alcohol;
11. a polymethyl methacrylate;
12. a polysulfone;
13. an polyamide;
14. a polycarbonate;
15. a polyvinyl chloride;
16. an epoxy;
17. a copolymer of the above; or
18. a combination thereof.

Preferred hydrophilic matrix materials comprise urethane, carbonate, amide, sulfone, vinyl chloride, acrylate, methacrylate, vinyl alcohol, ester or acrylamide moieties (most preferably, urethane). The matrix material also defines a modulus of 1 Pa to about 10 GPa. Preferably at least one matrix component of the present invention defines an elongation to break in the range of 25% to 1000%, more preferably 50%–500% and most preferably 100%–350%. The matrix material can be porous or non-porous. In one embodiment, the matrix material is non-porous; in another embodiment, the matrix material is non-porous and free of fiber reinforcement.

In a preferred embodiment, the dispersion of particles within the matrix material is substantially free of particle agglomerations capable of scratching a semiconductor substrate. Particle agglomeration can be minimized by agitation or mixing of the particle dispersion shortly prior to solidifying (e.g., de-watering).

In a highly preferred embodiment, an aqueous dispersion of submicron silica particles is vigorously mixed into a urethane latex and de-watered by oven drying. The urethane component of the urethane latex can be a polymer or in the alternative, can be a prepolymer which forms a final urethane polymer by a chemical reaction, such as by, chain extension, polyaddition, crosslinking or the like.

In a preferred embodiment, the particulate matter is first incorporated into a binder, and then broken down into small pieces, hereafter referred to as "clusters", by milling or any other particle producing process. The clusters can then be incorporated into the hydrophilic matrix material. In such an embodiment, as the matrix material wears, the binder material preferably causes particles to release. The binder material can be advantageous, because the particles can sometimes be incorporated into a binder (with minimal unwanted particle agglomeration) more easily than if the particles were directly incorporated into the hydrophilic matrix material.

A possible polishing layer matrix precursor is one capable of being cured or polymerized via any appropriate polymerization mechanism, such as substitution, addition or condensation polymerization reactions. Possible precursors include acrylated urethanes, acrylated epoxies, ethylenically unsaturated compounds, aminoplast derivatives having pendant alpha,beta-unsaturated carbonyl groups, isocyanurate derivatives having at least one pendant acrylate group, isocyanate derivatives having at least one pendant acrylate group, and combinations thereof.

Optionally, a diluent, such as a plasticizer, can be added to the hydrophilic matrix material of the present invention to soften or otherwise lower the modulus of the material, thereby making the phase more prone to wear, to dissolving or to otherwise diminishing during polishing. In one embodiment, the diluent is a polyol, such as, polyethylene glycol, methoxypolyethylene glycol, polypropylene glycol, polybutylene glycol, glycerol, polyvinyl alcohol, and combinations thereof. In one embodiment, the diluent is polyethylene glycol having an average molecular weight of from 200 to 10,000 and comprising 20 to 60 weight percent of the matrix material.

Optionally, an oxidizing component can be incorporated into the polishing layer of the present invention to promote oxidation of a metal layer to its corresponding oxide. For example, an oxidizing component can be used to oxidize tungsten to tungsten oxide; thereafter, the tungsten oxide can be chemically and/or mechanically polished and removed. Preferred oxidizing components for incorporation into the low modulus phase include oxidizing salts, oxidizing metal complexes, iron salts, such as nitrates, sulfates, potassium ferri-cyanide and the like, aluminum salts, quaternary ammonium salts, phosphonium salts, peroxides, chlorates, perchlorates, permanganates, persulfates and mixtures thereof. The amount should be sufficient to ensure rapid oxidation of the metal layer while balancing the mechanical and chemical polishing performance of the system.

Other possible additives include fillers, fibers, lubricants, wetting agents, pigments, dyes, coupling agents, plasticizers, surfactants, dispersing agents and suspending agents. The polishing pad matrix material can comprise up to 80 weight percent filler and other optional ingredients. Examples of optional additives include EDTA, citrates, polycarboxylic acids and the like. Although certain clays have been described as being capable of acting as polishing particles, for purposes of the present invention, the presence of clay materials within the low modulus phase are to be deemed as filler, not (high modulus phase) polishing particles.

Particle Clusters

Particles, particularly sub-micron ceramic particles tend to agglomerate into much larger sized particles, and this can be a problem, when creating the present invention. Such particle agglomeration can lead to scratching and can adversely affect polishing performance.

One way to avoid such unwanted agglomeration is to first: 1. mix the particles with a suitable binder, whereby the binder is initially in a flowable form; 2. agitating or stirring the mixture to thereby break up particle agglomerations and cause dispersion of the particles within the flowable binder; 3. Curing, de-watering or otherwise solidifying the binder, thereby dispersing the particles within a (now) solid binder, and thereby also preventing the particles from re-agglomerating; and 4. grinding or otherwise breaking the resulting material into fragments.

The resulting fragments will hereafter be referred to as "particle clusters." The particle clusters are then incorporated into or bonded onto the polishing layer matrix material, and the particles are thereby incorporated into the polishing pad, substantially free of unwanted particle agglomeration.

The use of particle clusters is also advantageous, because it has been found that ceramic particles (without a binder) tend to weaken the pad's mechanical structure, due to poor adhesion between the particles and the pad matrix. Such decreased mechanical integrity is far less prevalent with the use of particle clusters, particularly where a binder is chosen which is more compatible with or otherwise more effectively binds to the pad matrix.

The particle cluster binder material can be optimized for specific polishing applications. The particle type, concentration and distribution can be adjusted within the binder to further optimize polishing performance for specific applications.

A Preferred Method of Fabricating Particle Clusters

According to one embodiment of the present invention, particle clusters are fabricated by mixing an aqueous dispersion of polishing particles, preferably colloidal, submicron metal oxide ceramic particles, with an aqueous dispersion of urethane prepolymer. The urethane (in either its liquid pre-polymer state or its solid cured state) will hereafter be referred to as the "intra-cluster binder." The intra-cluster binder may be, but is not limited to, urethane, epoxy, acrylic-urethane, polyacrylamide, polymethylmethacrylate, polyamide, polycarbonate, polyvinylalcohol and polysulfone.

Useful particles can include, but are not limited to, $SiO_2$, $Al_2O_3$, $TiO_2$ and $CeO_2$. Particle sizes are preferably in the range of 10–1000 nm, more preferably 30–500nm and most preferably 50–300nm. Preferred concentrations of particles in the particle cluster are greater than 50 weight percent, more preferably greater than 75 weight percent and most preferably above 90 weight percent.

The resulting particle/particle binder mixture is preferably dried to remove water. Drying techniques may include oven drying, evaporation, spray-drying, etc. The resulting material is ground or milled into a fine powder, each granule of which constitutes a particle cluster. Grinding may be done by a mortar and pestle, roll mills, high-speed grinders, or other similar means. In one embodiment, the material may be ground into particle clusters ranging in size from 10–1000$\mu$(microns), preferably 25–500$\mu$, and more preferably 35–150$\mu$. The preferred size of the particle clusters will be governed by the size of the polishing particles, the grinding method and the polishing application for which they are produced.

In some instances, where conditioning is not desired, it is advantageous to achieve compositions which are somewhat friable (e.g., crumble under shear forces, preferably of less than 1000 Newtons). Friability allows a fresh supply of particles to be continuously introduced into the polishing fluid. Friability is achieved by high filler loadings and/or by use of high glass transition temperature polymers (glass transition temperatures preferably greater than 25 degrees Centigrade). When filler loadings are high, the particles are generally not fully surrounded by the polymer, creating a relatively brittle material. High glass transition temperature polymers tend to produce brittle matrices rendering the material relatively friable. Therefore, the rate of introduction of particles into the polishing fluid can be controlled by varying the particle loading and the intra-cluster binder (e.g., polymer).

Particle behavior during polishing is generally determined by how well the particles are held by the intra-cluster binder. The binder material and the particles can be optimized for best polishing performance. The concentration and properties of the particles within the particle cluster can be changed independent of the bulk properties of the polishing layer matrix. The size and concentration of the particle clusters within a polishing layer can also be varied to optimize performance.

Fabrication of Polishing Articles Containing Particle Clusters

In one embodiment of the present invention, particle clusters are incorporated into the polishing layer matrix by mixing the clusters into a flowable polishing layer matrix precursor and solidifying the matrix by curing, cooling or any other solidification operation. Alternatively, the particle clusters are bonded to the polishing layer matrix, while the matrix is in a flowable or non-flowable state.

Useful manufacturing techniques may include, but are not limited to, molding, casting, extrusion, spray-coating, web-coating, printing, sintering, photopolymerization, or the like. Additional processing may also be incorporated into the polishing pad manufacturing process, such as grooving, skiving, felting and foaming or the like. Grooving is intended to mean producing recesses of any shape on the article's polishing surface.

In one embodiment of the present invention, the polishing layer matrix (prior to solidification) with particle clusters dispersed therein is coagulated or otherwise coated and solidified upon a substrate, such as a felt or polymer film. Coagulation can form a porous, particle-containing material.

The particle clusters can be dispersed in liquid urethane precursors used in existing processes for the manufacture of polishing articles. The loading of particle clusters may be in the range of 1–95 weight percent. More preferably the particle loading is in the range of 10–90 and most preferably in the range of 25–85 weight percent. The concentration of the particle clusters can be varied over a wide range to achieve desired characteristics for different applications. For instance, high loading increases friability. Compositions preventing particle cluster agglomeration allow uniform distribution to be achieved.

The particle clusters should not interact chemically with the bulk constituents of the article in ways that would inhibit their performance. However, the inter-cluster polymeric matrix chemistry may be adjusted to obtain desired behavior of the particle clusters within the matrix. For instance, adjustments to the inter-cluster polymer chemistry may allow the particle clusters to attach to a surface of the article instead of being distributed evenly throughout.

In one embodiment the mixture of particle clusters in the inter-cluster polymeric matrix is transferred to a mold. The mixture is allowed to gel and then cured at elevated temperatures. The solidified cake is brought to room temperature and removed from the mold. The cake is skived, or similarly sectioned, to form polishing articles of desired thickness'. The articles may be used in this form or layered with other articles such as foams depending on the application. The top layers may be perforated or grooved.

In an alternative embodiment particle clusters may be dispersed in a water soluble polymer to allow release of particle clusters into an aqueous polishing fluid during use. Examples of such polymers include, but are not limited to, polyvinylalcohol or polyacrylamide.

Particle clusters may be mixed with an inter-cluster polymeric binder, preferably an aqueous dispersible polymer, then sprayed onto a substrate to form a polishing article. The preferred loading of particle clusters may be 5–95 weight percent, more preferably 20–90 weight percent, and most preferably 40–85 weight percent. The mechanical integrity of a sprayed article is dictated by the substrate. Therefore, the particle cluster loading can be higher in sprayed mixtures than in matrices that form an entire polishing article (or polishing article layer for a composite article). The substrate may be any material possessing the flexibility, elasticity and other properties necessary for successful polishing. The inter-cluster polymeric binder and substrate must have sufficient adherence to one another so that the particle clusters release the polishing particles more readily than the substrate releases the binder.

Particle clusters may be sprayed in layers. Each layer is dried and either totally or partially cured before application of subsequent layers. Preferably surfactants are added to the inter-cluster binder to enhance adhesion between layers. Layering serves to increase the thickness of the article, thereby increasing longevity. Layering also provides a means to vary the polishing capabilities within a single article. For example, layers may vary in particle size, type or loading, or in particle cluster type, size or loading. Also a single layer may contain different types, sizes or concentrations of particle clusters.

The rate of particle release into the polishing fluid can be controlled by varying the particle loading of the cluster, the particle cluster loading of the material, or by varying the types and ratios of all other materials comprising the clusters and polishing layer matrix.

In one embodiment of the present invention, particle clusters are mixed gradually into a reactive precursor to the polishing layer matrix. Once formed, the polishing layer matrix will comprise the low modulus phase and the particle clusters (which comprise a high modulus phase) are dispersed within the matrix. Examples of suitable mixing techniques include low shear and high shear mixing; high shear mixing being preferred. Ultrasonic energy may also be utilized in combination with the mixing step to lower the dispersion viscosity. The amount of air bubbles in the dispersion can be minimized by pulling a vacuum during or after the mixing step. In some instances, it may be preferred to add heat during mixing, generally in the range of 30 to 70 degrees Centigrade, to lower viscosity. The dispersion should have a rheology that coats well and in which the particles and other fillers do not settle.

A preferred matrix precursor material comprises a free radical curable component. Such polymerization can generally be initiated upon exposure to thermal or electromagnetic energy, depending upon the free radical initiator chemistry used. The amount of energy necessary to induce polymerization depends upon several factors such as the binder precursor chemistry, the dimensions of the matrix precursor material, the amount and type of particles and the amount and type of optional additives. Possible radiation energy sources include electron beam, ultraviolet light or visible light. Electron beam radiation, which is also known as ionizing radiation can be used at an energy level of about 0.1 to about 10 Mrad, preferably within the range of about 250–400 nanometers.

Also preferred is visible light radiation in the range of about 118 to 236 Watts per centimeter; visible radiation refers to non-particulate radiation having a wavelength within the range of about 400 to about 800 nanometers, preferably in the range of about 400 to 550 nanometers. It is also possible to use thermal energy to initiate the free radical polymerization, provided the polymerization chemistry is adaptable to thermally induced free radical initiation and curing.

In a preferred embodiment, the resulting mixture (of low modulus phase, polishing layer matrix precursor, particle clusters and optional ingredients, if any) is then applied to a substrate as the precursor is solidified (e.g., polymerized) to create a polishing layer comprising a high modulus phase (found within the clusters) and a low modulus phase (the polishing layer matrix and/or a second phase within the cluster). The substrate upon which the mixture is applied can be left bonded to the mixture to form a multilayer pad. In such an embodiment, the polymerization reaction should induce adhesion between the substrate and matrix material, and the substrate should be prone to surface wetting by the precursor matrix material.

In an alternative embodiment, the solidified mixture is peeled away from the substrate (such as a mold) to form a monolayer. This monolayer can be used as a pad or additional layers can be applied to the monolayer to provide a multilayered pad. Regardless of whether the final pad is a monolayer or multilayer, the multi-phased material will define at least one polishing surface of the pad.

The pad layer (pad matrix containing particles) can be partially or wholly solidified upon a belt, a sheet, a web, a coating roll (such as a rotogravure roll, a sleeve mounted roll) or a die. The substrate can be composed of metal (e.g., nickel), metal alloys, ceramic or plastic. The substrate may contain a release coating (e.g., a fluoropolymer) to permit easier release of the cured material from the substrate.

The partial or complete solidification of the polishing layer can occur with the mixture in contact with a mold or other means to induce a three dimensional pattern upon a surface of the mixture. Alternatively, the surface of the mixture can be modified by any available technique, such as, photolithography and/or machining. In yet another alternative embodiment, the matrix surface is not modified, but rather, the surface texture remains as was naturally produced when hardening (e.g. polymerizing) the precursor to provide the solid matrix material.

Flow Channels

Conventional polishing pads generally perform better with a series of large and small flow channels. In a preferred embodiment of the present invention, the flow channels continuously evolve (some are created as others diminish), as the multi-phase material abrades, dissolves or otherwise diminishes.

To provide consistency of polishing performance, any flow channel(s) should have a configuration (such as rods or cylinders perpendicular to the pad's surface) whereby as the pad wears to one half its useful life, the amount of surface area capable of contacting the substrate changes by less than 25%, more preferably less than 15% and most preferably less than 10%.

In another embodiment, pads in accordance with the present invention have a pyramidal, truncated pyramidal or other three dimensional surface texture, whereby the polishing surface area will tend to change as the pad wears. To offset variations in polishing surface area during the useful life of the pad, the downward pressure upon the pad can be adjusted to maintain a substantially constant frictional resistance between the pad and substrate. In a preferred embodiment, the protrusions are tapered, whereby (on average) the base of the protrusions are greater than the peaks.

Pad Longevity and "Self-Dressing"

High loadings of particles will generally decrease pad life, since such pads will tend to release particles and as these particles are released, the pad wears away. However such high loadings of particles can be advantageous, because the release of particles renews the polishing surface of the polishing layer and thereby can decrease the amount of conditioning necessary during the life of the pad.

Alternatively, by decreasing the particle loading, the polishing layer can become less friable, and this generally improves the pad's mechanical integrity and generally increases the pad's service life.

Sintered Polishing Pads Containing Particle Clusters

In accordance with the present invention, polishing articles (comprising particles and/or containing particle clusters) may be fabricated by a sintering process. In a preferred embodiment, the process begins by mixing the particle clusters and/or particles with low modulus phase material capable of being sintered. Concentrations of the low modulus phase material can range from 5 to 95 weight percent, preferably from 20 to 90 weight percent, and more preferably from 40 to 85 weight percent, depending upon the concentration of particles in the clusters and the desired loading in the polishing article. As the concentration of particle clusters increases, the friability of the polishing material tends to also increase.

Low modulus phase materials preferably sinter at temperatures and pressures below the decomposition temperature/pressure of the selected particle clusters. Nylon is a low modulus phase material which is often suitable for sintering polishing pads of the present invention. Other possible low modulus phase materials which may also be suitable for sintering include: thermoplastic polyurethanes, polyvinyl chloride, polycarbonate, polymethylmethacrylate, polysulfone and combinations thereof.

In the preferred embodiment, once a dispersion of particle clusters within the low modulus phase material is achieved, the mixture is poured into a mold and heated for sufficient time and temperature to fuse the structure together. By varying the temperature, time and pressure, different degrees of sintering can be achieved. At one extreme, a fully dense material can be sintered with no residual porosity and with high mechanical strength. Alternatively with partial sintering, the resulting material generally has open channels and is often porous and friable, at least to some degree. Thus, the degree of sintering can be used as yet another way of controlling the friability, including the propensity for releasing (high modulus) particles. This unique characteristic of the present invention generally reduces or eliminates the need for article conditioning by continually generating a fresh article surface during polishing.

The mold used can contain grooves or any other shaped designs, the pattern of which under the process of molding produces recesses in the article. Recesses may also be incorporated into the article after its formation by methods such as embossing or the like.

Other methods of producing sintered articles include, but are not limited to, wet forming, powder compaction and electrophoretic deposition.

EXAMPLES

Following are examples further describing the articles and methods of the present invention. They are not intended to be restrictive in any way.

Example 1

This example describes one embodiment of particle cluster fabrication according to the present invention. A formulation was prepared having 5 weight percent A-100* and 95 weight percent $CeO_2$**. A 1935 g $CeO_2$ aqueous dispersion (the concentration of $CeO_2$ in the dispersion was 21.5 %) was prepared and poured into a mixer. Using high shear mixing, 63 g of an aqueous dispersion of A-100 (concentration of 55%) was slowly added to the $CeO_2$ dispersion. Mixing continued for 30 min. The resulting mixture was poured into an aluminum pan and heated for fourteen hours at 60° C. until dried The dried mixture was ground by mortar and pestle to a fine powder. Each grain of powder represented a particle cluster.

*A-100—a water based colloidal dispersion of urethane and polyacrylate copolymer manufactured by Witco, Inc.
**$CeO_2$—water dispersion with a primary particle size of 200 nm, manufactured by Mitsui Chemical Company.

Example 2

This example describes a dispersion of particle clusters in an inter-cluster polymer.

TABLE 2

Weight Percent of Cluster/Interpolymeric Binder Formulation

| | |
|---|---|
| W-242* | 52.4 |
| Particle Clusters (as prepared in example 1) | 27.5 |
| XW** | 1.0 |
| Velvetex BK-35*** | 1.6 |
| Deionized water | 17.5 |

Three-hundred grams of a W-242 aqueous dispersion, 157.5 g of particle clusters produced as in Example 1, 6.0 g of XW, 9.0 g of surfactant and 100 g deionized water were mixed in a laboratory jar-mill (with zirconia as a ball-mill medium) for fourteen hours. A spray-gun was used to spray the mixture on the surface of a grooved IC-1400 pad (polishing pad manufactured by Rodel, Inc., Newark, Del.). After spraying, the pad was heated in an oven at 60° C. for fourteen hours. *W-242 urethane aqueous dispersion manufactured by Witco, Inc. XW epoxy aqueous dispersion manufactured by Witco, Inc. *Velvetex BK-35 surfactant manufactured by Henkel Corporation

Example 3

This example describes one embodiment for a method of polishing. Thermal oxide wafers were polished using a polishing pad prepared in Example 2. The pad was mounted on a Strasbaugh 6CA polishing machine platen. The pad was rinsed with de-ionized water and conditioned with 200 grit diamond grid for 3 min. A particle-free polishing slurry ($NH_4OH$ (1.7%) in water) was introduced on the surface of the pad at a rate of 100 ml/min. A platen speed of 60 rpm and a quill speed of 50 rpm were used. The pressure between the pad and the wafer was 8 psi. The wafer was polishing for 2 min. then rinsed with de-ionized water for 30 seconds. Seventy-five thermal oxide wafers were polished with one pad. There was no reconditioning between wafers. An average removal rate of 3000–3500 Å/min was achieved.

Particle Size Number and Valley Abrasion Number

In the following examples, the particle size number and valley abrasion number can be measured using the following procedures:

Particle Size Measurement

Any conventional method for determining particle size can be used. In one method, particle size is determined by a visual means of particle size analysis.

Apparatus
1. Glass microscope slides
2. Eye droppers (straight)
3. Test tubes with caps
4. Microscope (AO series 20)
5. Bausch & Lomb Omnicon Alpha Image Analyzer, with microscope adapter and calibration graticule.

Procedure

A. Sample Preparation
1. Obtain representative samples by a valid technique that is applicable to the material being analyzed.
2. Prepare microscope slides by an appropriate method to obtain a uniform dispersion. Two methods are:
    a. Dry dispersion
    1. Drop a small amount of material down a long 2" dia. Tube onto the microscope slide using a vibrating spatula.
    b. Wet dispersion
    1. Disperse sample in an appropriate dispersion medium such as methanol (trial and error may be needed depending on the material being tested). Use about $2 \times 10^3$ g/ml. and shake thoroughly.
    2. While sample is thoroughly dispersed withdraw a small portion from center of tube using an eye dropper.
    3. Deposit one drop on the center of the slide and allow the dispersant to evaporate.
    4. Check to make sure you have good distribution and sufficient sample for analysis of three areas on the slide.

B. Instrument Calibration
1. Connect the microscope to the Omnicon using the adapter tube.
2. Set up the microscope according to its operating manual.
3. Turn on the power for the Omnicon, turn the Scanner Sensitivity switch fully clockwise past the click stop to "Auto" (operate according to procedure recommended by Bausch and Lomb).
4. Using the calibrated graticule, determine the "K factor" for the Omnicon according to its operating manual. (This procedure consists of comparing the area of a circle on the graticule, as read by the instrument to the area for the same circle calculated from a known diameter).
5. Record the K factor for later use.

C. Particle Size Analysis
1. Mount the sample slide on the microscope stage (microscope light is normally set for 9.5 V).
2. Measure particle size distribution on the oversize count mode, starting at an appropriate lower limit, and proceeding to the appropriate upper limit by suitable intervals. The video picture shows the particles being analyzed (in the bounded area) and the total number of particles larger than the diameter that is set. The total number of particles can be read by setting the oversize count to zero, or by switching to the total area mode.
3. At least three areas per slide are measured for distribution and each measurement is repeated three times.

Calculations $$\% \text{ Larger:} \quad \frac{\text{number of particles greater than set size}}{\text{total number of particles}} \times 100 = \%$$

$$\% \text{ Smaller:} \quad \frac{\text{Total number of particles minus number of particles greater than the set size}}{\text{total number of particles}} \times 100 = \%$$

Actual diameter is the set diameter multiplied by the "K factor" which should be calculated prior to sample analysis.

Error

The smallest particle sizes (less than 10 microns) can be expected to yield a standard deviation of ±10% with a minimum of measurements. A larger sample will improve this considerably. The higher particle size intervals show standard deviations of ±2%.

Valley Abrasion Measurement

According to Procedure 65 of The Institute of Paper Chemistry, using Valley Abrasion Test Apparatus made by Voith-Allis, Inc.

A. Sample Preparation

Weigh out 100 grams of the particulate abrasive test material and measure 3.2 liters of distilled water. A wetting agent, such as Calgon-T, Pluronic-62, or equivalent, is added in an amount of 0.1% by weight to a small portion of the water and stirred into the abrasive material to make a thoroughly wet paste. When this is accomplished, gradually add the remaining water, stirring the slurry with a Lightnin' Mixer or similar mixing device. Check the pH of the slurry and adjust to approximately 7.0. Charge the slurry to the Valley Abrasion Tester and circulate the slurry with a pump. Check the pH once more before starting the test.

B. Operation (1) Conditioning the Wire in the Tester

A new wire is conditioned before it is used by inserting a wire in the Tester and running the sliding block across the wire for two hours (10,000 cycles) with distilled water only at the interface; 3.2 liters of distilled water are used. All other conditions are the same as those used in making a test. The conditioned wire is thoroughly washed, oven dried and its weight determined to the nearest milligram.

(2) Running a Test

A conditioned wire is placed in the frame of the Tester and the Tester is assembled. The abrasive slurry is poured onto the perforated sliding block of the Tester and the pump and block motion of the Tester is started. After 6,000 cycles (about 70 minutes) the Tester is stopped and the wire is removed and washed. The wire is then oven dried and weighed and the loss in weight is calculated. If the loss is under 100 milligrams, the same wire may be used for three successive tests. If the loss in weight is greater than 100 milligrams, the wire should be used only once. It is recommended that a wire be used only once when testing talcs in particular. When disassembling the Tester after running a test, all parts are thoroughly washed. The test sample is dumped and the equipment is flushed with tap water until the effluent becomes clear.

C. Constant Conditions and Specifications of Test Equipment

1. Pump: Model 500 Randolph, fitted with gum rubber tubing.
2. Motor arrangement: Bellows continuous cycling, adjustable stroke, foot mounted, Model B5313-2018 air motor; Bellows muffler No. A279; lubricator, filter, regulator and gauge assembly.
3. Pumping rate: 850–1050 ml./min.
4. Block composition: Micarta.
5. Weight of block and brass weight: 17.5–17.8 lb. (minus drive arm).
6. Block wear area: $3\frac{1}{16} \times 3\frac{11}{16}$ inches.
7. Block type: drilled, "Valley" design.
8. Stroke length: 4 inches
9. Block travel rate: 85 cycles/min.
10. Wire is 70×48-mesh plain weave, bronze cloth. Wire size is $3\frac{7}{16} \times 8\frac{13}{16}$ inches with 70 wires/inch in the long direction.

Abrasiveness is reported as milligrams lost in wire weight. Triplicate determinations are recommended. Checks to agree with ±10%.

Results

Virtually all sub-micron particles produce a product (particle size multiplied by valley abrasion number) of less than 100, more typically less than 200, more typically less than 300. For particles above a micron to fall within the product requirement of being below 300 (more preferably below 200 and more preferably below 100), the particles had to have a very low valley abrasion number; so low in fact that the particles would fracture, abrade or otherwise reduce in size at the polishing interface to less than a micron in size and would also be incapable of grinding or micro-grinding the surface being polished. As can be seen, these results provide a convenient index by which to choose abrasive materials having a particle size number and valley abrasion number sufficient to provide the most effective polishing in accordance with the invention.

Pad Plus Fluid

The polishing systems of the present invention comprise the (above described) polishing pad design in combination with a polishing fluid. Preferred polishing fluids comprise less than 95 weight percent particles, more preferably less than 40 weight percent particles, more preferably less than 25 weight percent particles and most preferably 0–10 weight percent particles. In one embodiment, the polishing fluid comprises an amine, polyol, carboxylic acid, halogen ion and/or oxidizing agent.

During polishing, preferred polishing fluids provide increased reactivity or corrosivity at the point of particle contact or interaction with a surface protrusion. For example, if the polishing fluid is more corrosive at higher temperatures, then corrosion will preferentially occur at this point of contact, since the temperature at the point of contact is generally higher than at non-contact portions of the surface. A particularly preferred polishing fluid provides a corrosion rate which increases as the protrusion is stressed (i.e., bond strain is induced) due to particle contact or interaction.

Dilute solutions of hydrofluoric acid are corrosive to $SiO_2$ and silicate materials. The rate of corrosion is sensitive to bond strain, particularly tensile strain. The corrosion rate increases by more than an order of magnitude. Such a reactive solution when used in accordance with the polishing pads of the present invention will generally result in a highly selective local removal in the proximal vicinity of the particle contact, due to the increased local bond strain in the substrate.

A preferred polishing fluid of the present invention for use in the polishing of silicon is a water based slurry, comprising about 0.05 to about 5 weight percent amine, preferably primary amine capable of receiving a free proton. In addition or in the alternative to the amine the following can be used: a halogen ion, particularly a fluoride ion; a hydroxyl ion; and/or a superoxide, such as peroxide, persulfate, permagnate or the like. A preferred pH for the polishing fluid of this embodiment is in the range of about 2–12.

Recycle of Polishing Fluid

In another embodiment, the polishing fluid is recycled back into the polishing operation. Prior to re-use, the polishing fluid can be filtered or otherwise processed or rejuvenated. If the slurry comprises a dilute hydrofluoric acid solution, the pH and HF concentration may be measured in situ before and after use. Provisions for additional HF into the slurry as needed to maintain a constant acid concentration and pH can be introduced into the recirculation system.

Similarly, for a slurry comprising 50 parts per million ozone in water at pH 4, the oxidation potential of the solution (which is directly proportional to the ozone concentration), and the pH may be measured with conventional electrodes; acid and ozone can then be added during the recirculation process to maintain consistency in polishing fluid performance.

Drawings

Figure 1:
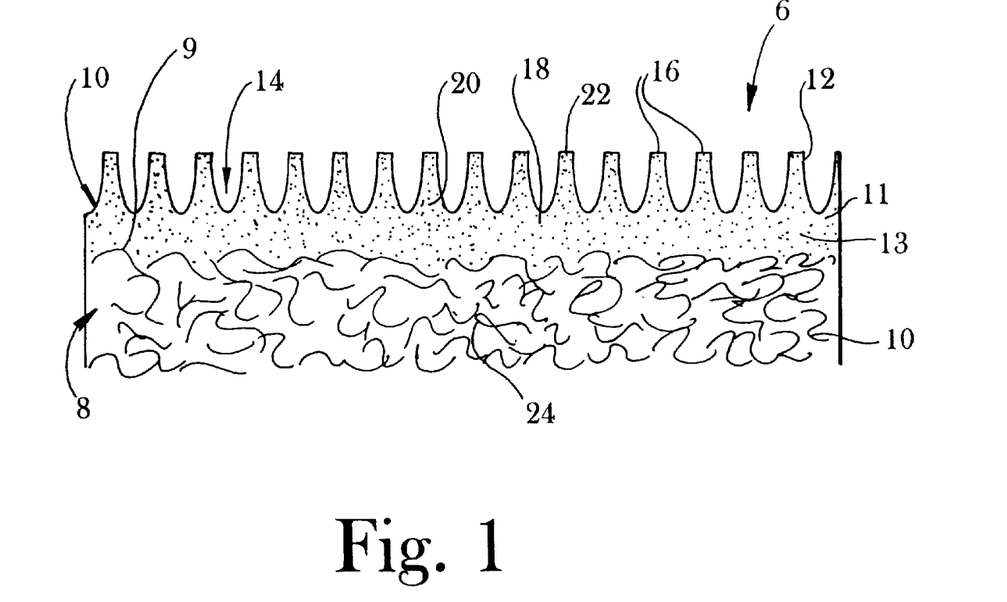
FIG. 1 is an enlarged cross sectional view of a portion of a three-dimensional, textured, fixed abrasive article useful in the process of the present invention. "Three dimensional" is intended to mean an abrasive article having numerous abrasive particles extending throughout at least a portion of its thickness such that removing some of the particles during planarization exposes additional abrasive particles capable of performing the planarization function. "Textured" is intended to mean an abrasive article having raised portions and recessed portion in which at least the raised portion contain abrasive particles and binder. "Fixed abrasive" is intended to mean abrasive bonded to a matrix, except as may be generated during the polishing or planarization process.

Referring now to the drawings, FIG. 1 is an enlarged sectional view showing a polishing pad in accordance with the present invention. The pad 6 comprises backing or support layer 8 having front surface 9. Abrasive coating 10 is bonded on front surface 9 of backing 8. Abrasive coating 10 is three dimensional and comprises a plurality of abrasive composites 12. In this particular embodiment, abrasive composites 12 are truncated pyramids. There are recesses or valleys 14 between adjacent abrasive composites 16. Preferably a second row of abrasive composites is adjacent to the illustrated row, whereby the adjacent row is offset relative to the illustrated row. The abrasive composites 16 comprise a plurality of abrasive particles 18 dispersed in binder 20. Outermost point 22 of the abrasive composite is generally closest to contacting (if not actually contacting) the semiconductor device, memory disk or precursor thereto during the polishing operation. Optionally, fibers 24 can be used to reinforce the pad backing.

Figure 2:
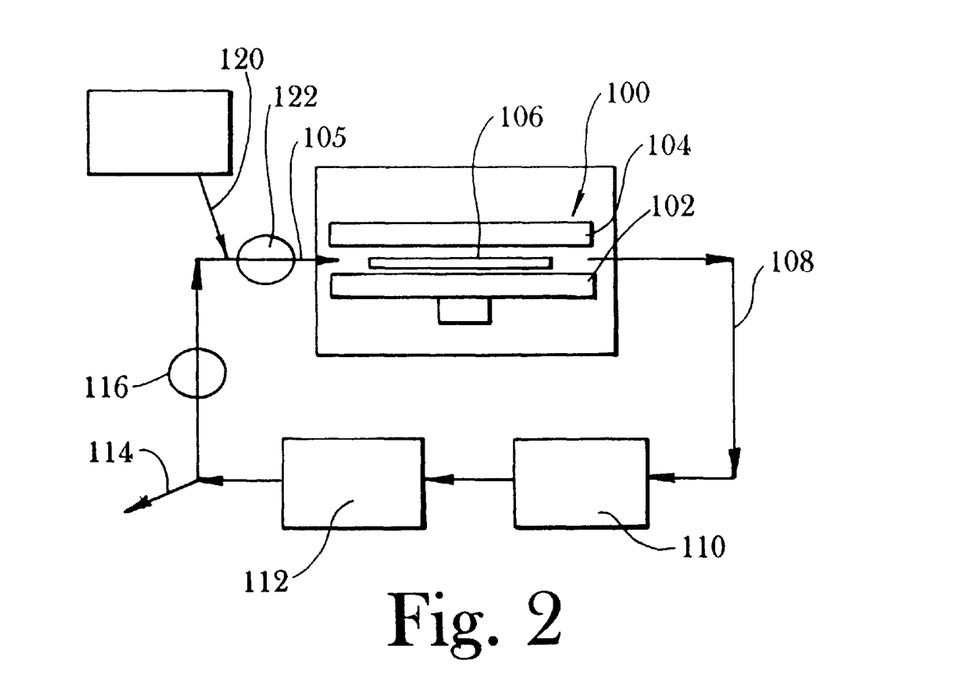

FIG. 2 provides a schematic representation of a polishing process in accordance with the present invention. The polishing apparatus is shown generally at 100, comprising a table 102, workpiece 106 and polishing pad 104. Polishing fluid is pumped into the polishing interface (between the pad and workpiece) by influent line 105. Used polishing fluid exits the polishing apparatus via effluent line 108.

The used polishing fluid is filtered by filter 110, and deionized by ion exchange column 112. Excess polishing fluid can be removed by waste line 114. Sensor 116 then monitors the pH or other chemical properties of the recycled fluid, and inlet line 120 provides appropriate additives to the recycled fluid, thereby rejuvenating it for another polishing cycle. Sensor 122 monitors the polishing fluid entering the polishing operation to ensure proper pH or other properties which are desired to be monitored for quality control.

Nothing from the above discussion is intended to be a limitation of any kind with respect to the present invention. All limitations to the present invention are intended to be found only in the claims, as provided below.

What is claimed is:

1. A method of manufacturing a memory disk or a semiconductor device, comprising:
    placing an aqueous fluid between a substrate and a fixed abrasive pad, the fluid having a consistent pH whereby the pH varies by less than ±3 during polishing, the substrate being a precursor to the memory disk or a precursor to the semiconductor device, the substrate further comprising a substrate surface, the fixed abrasive pad having a three dimensional fixed abrasive polishing layer wherein the three dimensional fixed abrasive polishing layer exhibits a plurality of protrusions having recesses between the protrusions, the fixes abrasive polishing layer having a plurality of nanoasperities, the fixed abrasive polishing layer comprising a plurality of particles, whereby the average particle size multiplied by the particle's valley abrasion number is less than 300, the polishing layer further comprising a polishing surface;
    moving the polishing surface and the substrate surface relative to and biased toward one another as at least a portion of the fluid is maintained between the surfaces, the fluid between the surfaces acting to prevent at least 20% of the surfaces, on average, from touching one another during polishing;
    biasing the surfaces together by applying a uniform pressure of less than 25 pounds per square inch and compressing the polishing surface by less than 15 microns, thereby chemically and mechanically polishing the substrate surface to thereby increase the planarity of the substrate surface;
    releasing at least a portion of the articles from the fixed a pad during polish into the polishing interface, thereby creating a plurality of new nanoasperities at the polishing interface;
    varying the surface of the fixed abrasive pad at the polishing interface by less than 10% during the polishing operation;
    wherein said polishing layer has a matrix material as a continuous phase and said particles as a discontinuous phase, said matrix material having:
        i. a density greater than 0.5 g/cm$^3$;
        ii. a critical surface tension greater than or equal to 34 milliNewtons per meter;
        iii. a tensile modulus of 0.02 to 5 GigaPascals;
        iv. a ratio of tensile modulus at 30° C. to tensile modulus at 60° C. of 1.0 to 2.5;
        v. a hardness of 25 to 80 Shore D;
        vi. a yield stress of 300–6000 psi;
        vii. a tensile strength of 1000 to 15,000 psi; and
        viii. an elongation to break less than or equal to 500%.

2. A method in accordance with claim 1, wherein the fixed abrasive pad further comprises a support layer in addition to the polishing layer.

3. A method in accordance with claim 2, wherein the support layer is flexible.

4. A method in accordance with claim 2, wherein the support layer is rigid.

5. A method in accordance with claim 2, wherein the polishing pad comprises both a rigid supporting layer and a flexible supporting layer, said supporting layers providing adjustment to the elastomeric properties of the overall polishing pad.

6. A method in accordance with claim 2, wherein at least one support layer is incorporated into the polishing pad by lamination.

7. A method in accordance with claim 2, wherein the particulate matter consists essentially of ceria.

8. A method in accordance with claim 1, wherein the protrusions have a whole or partial pyramidal shape.

9. A method in accordance with claim 1, wherein the protrusion have an irregular shape.

10. A method in accordance with claim 1, wherein the protrusions are tapered and comprise an end portion and a base portion, the end portion of the protrusion being smaller than the base portion of the protrusion.

11. A method in accordance with claim 1, wherein the polishing surface is compressed by less than 5 microns during the polishing operation.

12. A method in accordance with claim 1, wherein the amount of particles in the polishing layer is 1–30 wt % based upon the total weight of particles and matrix material.

13. A method in accordance with claim 1, wherein the polishing layer defines an open celled structure.

14. A method in accordance with claim 1, wherein the fixed abrasive polishing layer comprises a plasticizer which increases flexibility of the polishing layer.

15. A method in accordance with claim 1, wherein the particulate matter comprises ceria.

16. A method in accordance with claim 14, wherein the plasticizer is a glycol or a glycol derivative.

17. A method in accordance with claim 1, wherein the fluid comprises 0–50 weight percent abrasive fluid particles, wherein the abrasive fluid particles can be the same as or different from the particles in the polishing layer, said fluid particles having an average diameter of less than 1 micron.

18. A method in accordance with claim 17, wherein the fluid comprises less than 5 weight percent abrasive fluid particles.

19. A method in accordance with claim 1 wherein the polishing fluid comprises a pH modifier.

20. A method in accordance with claim 1 wherein the polishing layer comprises ceramic particles having an average particle size in the range of 0.1 to 0.4 microns, at least 50 weight percent of said particles being alumina, silica, ceria, or a combination thereof.

21. A method in accordance with claim 1, whereby the chemical mechanical polishing is accomplished by Hertzian indentation, fluid based wear or other non-microgrinding polishing mechanism.

22. A method in accordance with claim 1 further comprising:
    collecting at least a portion of the polishing fluid from the polishing interface, filtering the collected polishing fluid and returning the collected polishing fluid back into the polishing interface.

23. A method in accordance with claim 22 further comprising:
    modifying the pH of the collected polishing fluid prior to returning the collected polishing fluid back into the polishing interface.

24. A method in accordance with claim 1, wherein the polishing layer is self dressing.

25. A method in accordance with claim 24, wherein the polishing layer is substantially free of macro-defects.

26. A method in accordance with claim 1, wherein the substrate is polished without interrupting the polishing operation for conditioning of the polishing layer.

27. A method in accordance with claim 26, wherein the polishing layer is not conditioned during polishing.

28. A method in accordance with claim 1, wherein less than 50 microns of the polishing surface is worn away by conditioning.

29. A method in accordance with claim 1, wherein at least one of the protrusions is molded.

30. A method in accordance with claim 1, wherein the polishing layer is created by partially or wholly solidifying a polishing layer precursor upon a belt, a sheet, a web, a coating roll or a die.

31. A method in accordance with claim 1, wherein the polishing surface is compressed by less than 10 microns during the polishing operation.

32. A method in accordance with claim 1, wherein the polishing layer comprises a plurality of hard particles and a plurality of soft particles.

33. A method in accordance with claim 1, wherein the substrate is a combination of copper and an insulating material.

34. A method in accordance with claim 1 wherein the substrate comprises an organic polymer.

35. A method in accordance with claim 1 wherein said particles have an average particle size of less than 1 micron.

36. A method in accordance with claim 35 wherein said particles have an average particle size of less than 0.6 microns.

37. A method in accordance with claim 1 wherein said matrix material comprises at least one moiety from the group consisting of: 1. a urethane; 2. a carbonate; 3. an amide; 4. an ester; 5. an ether; 6. an acrylate; 7. a methacrylate; 8. an acrylic acid; 9. a methacrylic acid; 10 . a sulphone; 11. an acrylamide; 12. a halide; 13. an imide; 14. a carboxyl; 15. a carbonyl; 16. an amino; 17. an aldehydric; 18. a urea; and 19. a hydroxyl.

* * * * *